United States Patent [19]

Janton

[11] Patent Number: 4,459,564
[45] Date of Patent: Jul. 10, 1984

[54] WAVEGUIDE TUNABLE OSCILLATOR CAVITY STRUCTURE

[75] Inventor: Walter M. Janton, Bellmawr, N.J.
[73] Assignee: RCA Corporation, New York, N.Y.
[21] Appl. No.: 326,148
[22] Filed: Nov. 30, 1981
[51] Int. Cl.³ .............................................. H03B 7/14
[52] U.S. Cl. .................................. 331/96; 331/107 G; 331/107 DP
[58] Field of Search ............... 331/96, 107 G, 107 DP

[56] References Cited

U.S. PATENT DOCUMENTS

| | | | |
|---|---|---|---|
| 3,628,185 | 12/1971 | Evans et al. | 331/107 DP |
| 3,668,551 | 6/1972 | Kondo | 331/107 DP |
| 3,824,489 | 7/1974 | Spitalnik | 331/107 R |
| 3,878,480 | 4/1975 | Hulderman et al. | 331/96 |
| 3,882,419 | 5/1975 | Swartz et al. | 331/96 |
| 3,943,463 | 3/1976 | Kuno et al. | 331/107 R |

*Primary Examiner*—John S. Heyman
*Attorney, Agent, or Firm*—J. S. Tripoli; R. L. Troike; R. E. Smiley

[57] ABSTRACT

A length of conventional hollow waveguide having an interior rectangular cavity has openings in the broad walls along a common axis. A diode support structure positions a negative resistance diode in the waveguide through one opening. A DC bias conductor structure positions a bias conductor through the other opening and into contact with the diode to provide a DC bias thereto. These two structures are secured together and to the conventional waveguide structure.

9 Claims, 4 Drawing Figures

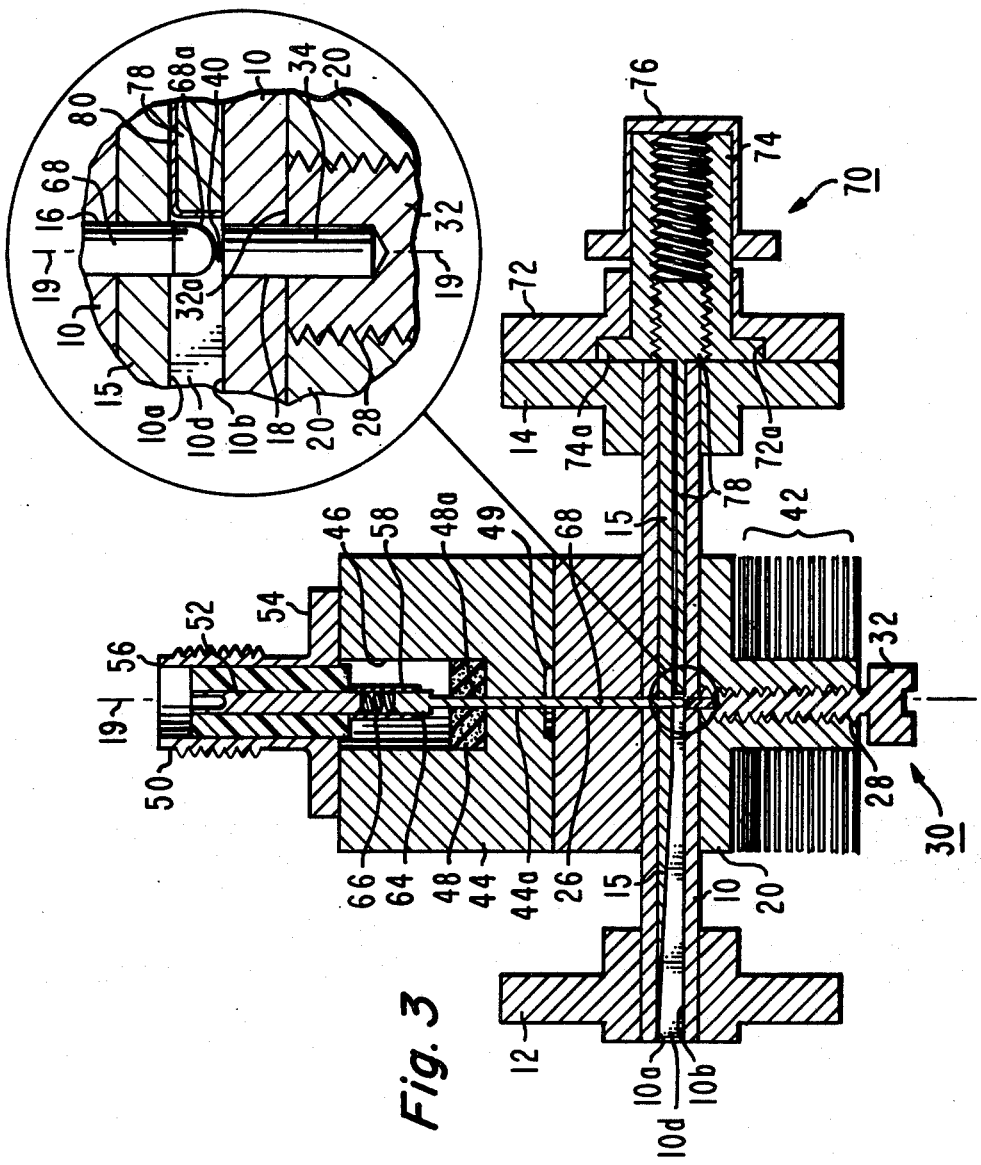

WAVEGUIDE TUNABLE OSCILLATOR CAVITY STRUCTURE

This invention is concerned with a waveguide oscillator assembly and more particularly with such an assembly which includes an oscillator cavity.

Microwave and millimeter wave systems often employ waveguide assemblies for passing signals. Such assemblies often include a special section of waveguide which forms an oscillator cavity in which resides an oscillator device such as an IMPATT diode.

One such oscillator cavity assembly is illustrated in U.S. Pat. No. 3,943,463, issued Mar. 9, 1976, to H. J. Kuno et al. That oscillator cavity is typical of the prior art in that the actual waveguide cavity, as illustrated in FIG. 1 thereof, in which the oscillating diode assembly resides, is comprised of several pieces of metal which are secured together typically by screws. Such an arrangement has physical spaces between the various pieces of metal which undesirably causes RF energy to be trapped and dissipated. Further, a different set of parts must be designed and constructed for each different internal size of waveguide, the internal size being dependent upon the frequency at which the waveguide is to pass.

In accordance with a preferred embodiment of the present invention a waveguide cavity comprises a length of conventional hollow waveguide having opposed orifices in two opposed walls thereof. A negative resistance diode is positioned in one of said orifices. A bias voltage conducting means extends to the other orifice and contacts the diode. A structure surrounds the waveguide for securing the negative resistance diode and bias conductor in place in said waveguide.

In the drawings:

FIG. 3 is a cross-sectional view of the waveguide structure of FIG. 2 taken along the lines 3—3 of FIG. 2; and FIG. 4 is an expanded view of a portion of FIG. 3.

Figure 1:
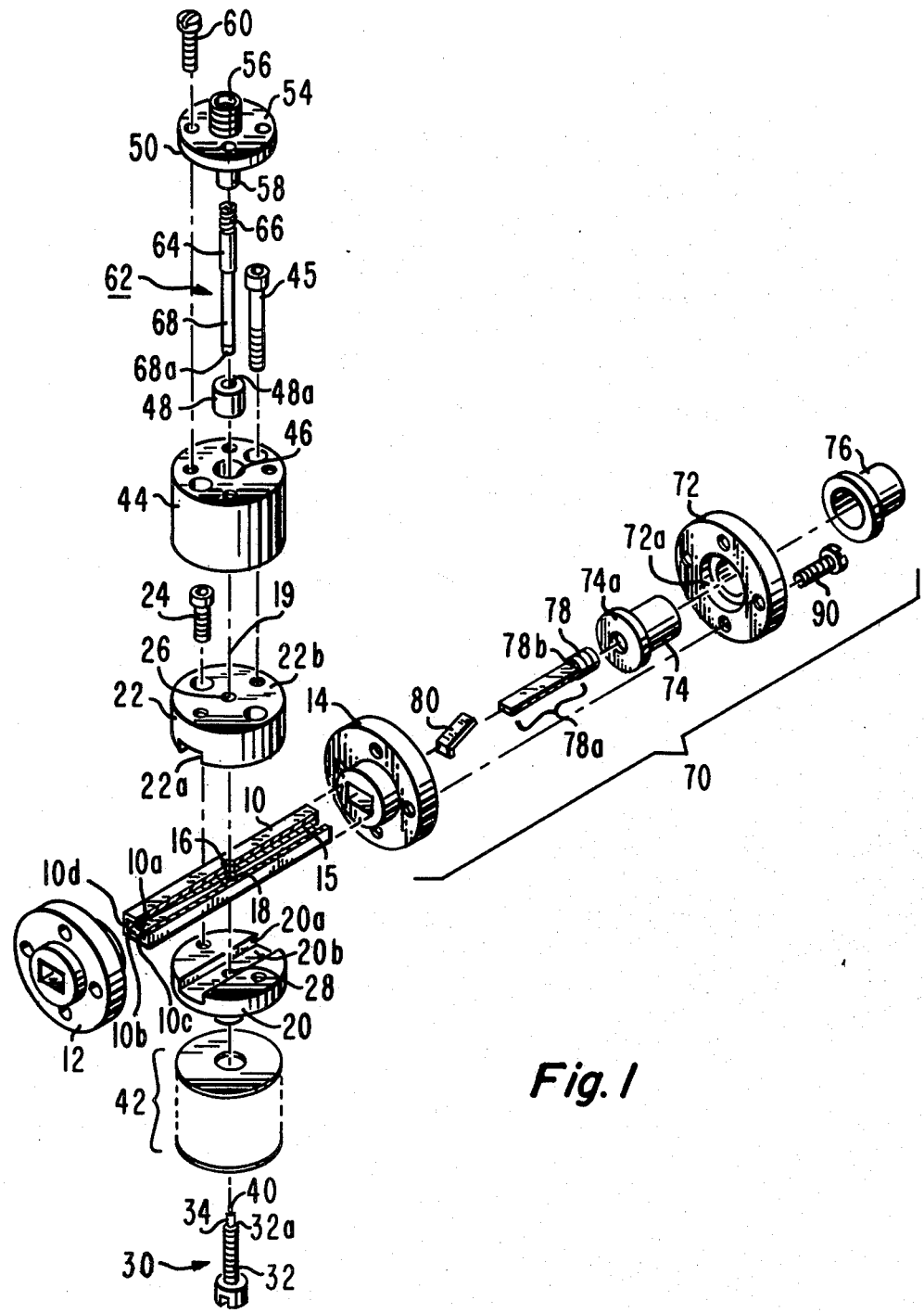
FIG. 1 is an exploded isometric view of the waveguide structure embodying the invention.
Figure 2:
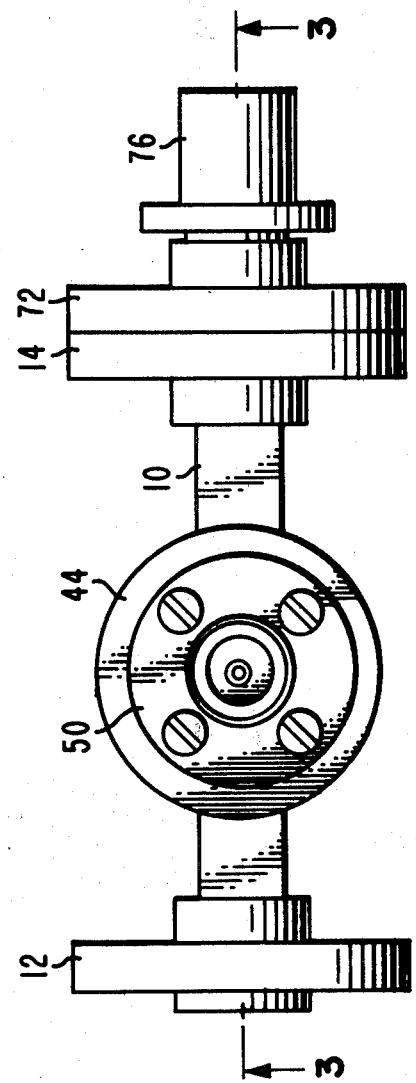
FIG. 2 is a plan view of the waveguide structure embodying the invention.

With reference to FIG. 1, a length of standard waveguide 10, partly broken away, suitable for passing microwave or millimeter wave frequencies includes, at its ends, standard flanges 12 and 14, respectively. Waveguide 10, which may be of either a rectangular or round (not shown) outer cross-sectional shape, is typically extruded so as to be made of one piece of metal with no cracks or slots through which microwave or millimeter wave signals can escape.

Regardless of the outer shape of the waveguide, the inner shape of the signal passage way is rectangular comprising two opposed broad sidewalls 10a and 10b and two opposed narrow sidewalls 10c and 10d. The standard waveguide is modified by securing a tapered insert 15 into it. The tapered insert forms a half height tuning cavity and a tapered transition near flange 12. Also, two opposed orifices 16 and 18 are positioned opposite one another centered in the broad walls 10a and 10b and centered along common axis 19. The frequency range which can be handled by a given waveguide is a function of the size of the opening formed by walls 10a, 10b, 10c and 10d. A given manufacturer of waveguide material will supply different inside opening sizes corresponding to numerous frequency ranges, but with only one standard outside size (diameter or length and width dimensions).

Thus, unlike the prior art waveguide cavity structure which must be built specifically for each different frequency range, the structure which is about to be described can be of one standard size for many different frequency ranges.

A cylindrical copper cooling diode support structure 20 and cylindrical brass first bias support means 22 have mating slots 20a and 22a, respectively, shaped and sized to the shape and size of the outside of waveguide 10. Support structure 20 includes an internally threaded cylindrical opening 28 having its axis normal to surface 20b of slot 20a. Support means 22 includes a cylindrical opening 26 having its axis normal to surface 22b of the support means. Support means 20 and 22 are clamped around waveguide 10 by suitable means such as screws 24. Supports 20 and 22 are located along waveguide 10 at such a position that the opening 26 in support 22 is axially centered with opening 16 in waveguide 10 and threaded opening 28 in support 20 is axially centered with opening 18 in waveguide 10 along axis 19.

Opening 18 is adapted to receive a threaded diode support assembly 30 best seen in FIGS. 3 and 4. Assembly 30 comprises a copper machine screw 32, a short length of cylindrical copper rod 34 positioned in one end of the machine screw and the actual negative resistance device such as an IMPATT diode 40 positioned on the tip of rod 34. The length of rod 34 which protrudes from screw 32 is chosen to be such that when screw 32 is positioned in support 20 such that the tip 32a of the screw rests against the outer surface of waveguide 10, diode 40 is positioned at the proper location inside the waveguide opening. A plurality of cooling fins 42 are secured to support 20 for the purpose of cooling diode 40. In some applications, the cooling fins may be replaced by a water cooling jacket. Particularly in experimental situations, but also in production situations, it is necessary occasionally to replace diode 40. This is easily done by merely unscrewing screw 32 and installing a new screw with a new diode or placing a new diode 40 on rod 34 and then reinstalling the same screw 32.

A cylindrical brass second bias support means 44 of diameter similar to that of support 22 is secured to support 22 typically by means of screws such as 45. Support 44 has an axially located opening 44a (best seen in FIG. 3) which is in line with opening 26 in support 22. The upper portion of support 44 has a larger opening 46 axially centered with opening 44a. A microwave or millimeter wave absorber 48 of standard material is positioned in opening 46. The standard absorber material has an opening 48a which also is in line with opening 44a and with opening 26. As seen in FIG. 3, a cylindrical cavity 49 is machined in the surface of support 44 which is in contact with support 22. Cavity 49 is coaxial with axis 19. Cavity 49 serves as a radio frequency filter or choke.

As known to those skilled in the art, the diameter of cavity 49 depends on the frequency of oscillation of the structure. The diameter of cavity 49 may be larger than the width of waveguide wall 10a which is why separate supports 22 and 44 are needed. If the diameter of cavity 49 is less than the width of wall 10a, the cavity can be machined within slot 22a of support 22 which can be enlarged to the size of supports 22 and 44 thus eliminating the need for a separate support 44.

A standard DC connector 50, Model Number OSM-204, manufactured by Omni Spectra, 140 Fourth Ave., Waltham, Mass. is modified essentially only in that the center connector pin 52 thereof (see FIG. 3) is shortened from its standard length which is approximately equal in length to the length from flange 54 to upper surface 56 of the connector. A brass sleeve 58 is secured to the shortened connector pin 52, preferably by soldering. The connector 50, centered on axis 19, is secured to support 44 by conventional means such as screws 60. A DC contact pin assembly 62 comprises a brass cylindrical portion 64 sized for a sliding fit within sleeve 58. A nonmagnetic bias spring 66 typically is mechanically secured to cylinder 65 such as by soldering and an elongated linear and stiff cylindrical contact wire 68 is secured to the opposite end of cylinder 64 such as by soldering or staking. The insulated contact wire 68 is typically a length of insulated transformer wire which consists of copper surrounded by a layer of insulating material. The length of contact wire 68 is chosen such that when connector 50 is in place on support 44, the tip 68a of insulated wire 68, which has a non-oxidizing conductive metal such as gold applied thereto, is urged lightly into contact with diode 40 so that bias voltage applied to the connector can be transmitted through connector pin 52, bias spring 66, cylinder 64 and wire 68 to the diode. As changes in temperature occur within the various structural pieces, thus causing their dimensions to vary, essentially constant contact pressure is maintained on diode 40 due to the presence of spring 66.

Fine tuning of the waveguide assembly is enabled by means of a tuning short assembly 70 which is secured to waveguide flange 14. The tuning short assembly comprises a short support flange 72 sized to couple to flange 14. Rotatably secured to support 72 is an internally threaded support member 74. A flange 74a on threaded support 74 cooperates with an enlarged cylindrical opening 72a in support 72. A short tuning knob 76 is mechanically connected to threaded support 74. The actual short is comprised of a section of threaded rod 78. A large portion of the threaded rod is removed as at 78a and the rod is sized for a tight sliding fit inside of the waveguide cavity.

Because it is impossible to exactly size the threaded rod to the waveguide opening a section of flat spring material 80 is secured to the end of threaded short 78. The spring pushes against tapered insert 15 and at the same time urges the opposite face of threaded short 78 against wall 10b. As knob 76 is rotated thereby rotating threaded short support 74, the actual threaded short 78 travels in or out along the waveguide cavity. The length of the flattened portion 78a of threaded rod 78 is selected such that when surface 78b of the full portion of the threaded rod bottoms against the end of waveguide 10, the distal end of the short just misses contacting conductor 68 and diode 40. This situation is illustrated in FIG. 3.

For operating purposes flange 12 is connected to a mating flange from another standard section of waveguide. Bias DC current is supplied by means (not shown) to connector 50 and thence along the conductive chain of elements to the bias connection point of diode 40. The tuning knob 76 is turned until short 78 is positioned to match the impedance of the diode to provide the maximum output power from diode 40. As elements 22, 44 and 68 change length due to temperature, cylinder 64 slides up and down in sleeve 58 such that spring 66 urges conductor wire 68 into contact with desired pressure with diode 40. When it is desired to change diode 40 for any reason, assembly 30 is unscrewed from support 20 and the change is easily made by substituting a new assembly 30 or changing diode 40 on existing assembly 30. When it is desired to operate at an entirely different frequency range, than waveguide 10 is capable of supporting, the support structures 44, 22 and 20 are simply removed from waveguide 10 and inserted onto a new waveguide 10 of the same exterior dimensions as waveguide 10 but with different interior dimensions than those of waveguide 10. Also, the tuning short assembly 70 is also merely unscrewed from flange 14 and secured to the new section of standard waveguide. It will be realized that short 78 and tapered insert 15 have to be changed to accommodate the interior size of the new waveguide.

What is claimed is:

1. A tunable waveguide cavity structure comprising in combination:

a length of conventional hollow waveguide structure having an interior rectangular cavity extending the length thereof, said cavity being formed of two opposed relatively wide walls orthogonal to two opposed relatively narrow walls;

an orifice in each wide wall, the two orifices sharing a common axis;

a negative resistance diode;

a diode support structure for said diode separate from said hollow waveguide and positioned substantially outside said waveguide and including a diode supporting portion of said structure extending through one of said orifices to support said diode in said hollow portion of said waveguide;

a DC bias conductor;

a conductor support structure for said conductor separate from said hollow waveguide and positioned substantially outside said waveguide in a position such that said conductor extends through the other of said orifices for making electrical contact with said diode for providing a DC bias voltage thereto; and said diode support structure and conductor support structure being secured together to clamp therebetween said length of conventional waveguide.

2. The combination as set forth in claim 1 wherein said length of waveguide further includes a standard waveguide coupling member attached to at least one end of said waveguide and wherein there is further included a movable short assembly secured to said coupling, said movable short assembly including a movable short member extending into said hollow interior of said waveguide and having a tip thereof which is positionable along said waveguide relative to the location of said diode.

3. The combination as set forth in claim 1 wherein said diode support structure includes a threaded opening having an axis in common with the orifice axes and an exterior threaded member including, at one end thereof, said diode for threaded insertion in said threaded opening in said structure, said threaded member having a shoulder portion for automatically positioning said diode in said cavity when said threaded member of said structure is inserted in the other portion of said structure, the distance between said shoulder and said diode being constructed such that said diode resides just at the proper location in said waveguide cavity when said shoulder contacts said waveguide.

4. The combination as set forth in claim 1 wherein said conductor support structure includes spring bias means within said conductor structure for urging one end of said conductor to contact said diode.

5. The combination as set forth in claim 1 or 4 wherein said conductor is a length of transformer wire comprising an inner copper conductor and an outer insulating shield.

6. The combination as set forth in claim 2 wherein said movable short member comprises a threaded portion thereof having a relatively large diameter threaded portion and a relatively small size rectangular portion extending therefrom, said rectangular portion sized to fit within said waveguide cavity and wherein said movable short assembly further includes internally threaded rotatable means which, when rotated, causes said short member to move toward and away from said diode.

7. The combination as set forth in claim 6 wherein the end of said member nearest said diode further includes a spring bias means for combining with said member to more nearly fill said waveguide cavity than would the member alone.

8. The combination as set forth in claim 1 wherein said diode support structure includes a plurality of cooling fins for providing cooling to said diode.

9. The combination as set forth in any of claims 1, 2, 3, 4, 6, 7, or 8 further including a tapered insert positioned in said hollow waveguide adjacent one of said broad walls.

* * * * *